(12) United States Patent
Macias (10) Patent No.: US 10,566,895 B1
(45) Date of Patent: *Feb. 18, 2020

(54) TUBE LIGHT WITH IMPROVED LED ARRAY

(71) Applicant: Colt International Clothing Inc., Santa Clarita, CA (US)

(72) Inventor: Guillermo Macias, Santa Clarita, CA (US)

(73) Assignee: COLT INTERNATIONAL CLOTHING INC., Santa Clarita, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/537,932

(22) Filed: Aug. 12, 2019

Related U.S. Application Data (63) Continuation of application No. 15/818,306, filed on Nov. 20, 2017, now Pat. No. 10,411,582, which is a
(Continued)

(51) Int. Cl.
*F21K 9/278* (2016.01)
*F21S 10/02* (2006.01)
(Continued)

(52) U.S. Cl.
CPC ............... *H02M 1/12* (2013.01); *F21K 9/27* (2016.08); *F21K 9/272* (2016.08); *F21K 9/278* (2016.08); *F21S 10/02* (2013.01); *F21S 10/023* (2013.01); *H02M 7/53803* (2013.01); *F21W 2131/406* (2013.01); *F21Y 2103/10* (2016.08); *F21Y 2115/10* (2016.08)

(58) Field of Classification Search
CPC ........... F21S 10/023; F21S 10/02; F21K 9/27; F21W 2131/406
See application file for complete search history.

(56) References Cited

U.S. PATENT DOCUMENTS

| 6,583,566 B1 | 6/2003 | Jin et al. |
|---|---|---|
| 6,860,628 B2 | 3/2005 | Robertson et al. |
| (Continued) | | |

OTHER PUBLICATIONS

Box, Harry C., Set Lighting Technician's Handbook, Fourth Edition, 2010, cover page, title page, copyright page, Chapter 6 (pp. 119-149), p. 208, Chapter 10 (pp. 227-249) (total 58 sheets), by Focal Press, Burlington, MA (USA).
(Continued)

*Primary Examiner* — William N Harris
(74) *Attorney, Agent, or Firm* — David L. Hoffman; Hoffman Patent Group (57) ABSTRACT

Apparatus and system for producing light using LED lighting with output within a predetermined desired color temperature range for commercial lighting uses. A preferred embodiment includes a first and second group of LEDs arranged in an alternating matrix configuration, each group of LEDs configured to produce light in a predetermined color temperature range. In a preferred embodiment, an LED light system includes a tubular LED lamp having substantially the same size and dimensions as a traditional fluorescent lamp tube and a control box for controlling power input and power gain to the first, second, or both groups of LEDs.

30 Claims, 5 Drawing Sheets

Related U.S. Application Data continuation of application No. 15/450,372, filed on Mar. 6, 2017, now Pat. No. 9,845,924, which is a continuation of application No. 13/896,868, filed on May 17, 2013, now Pat. No. 9,719,642.

(60) Provisional application No. 61/648,554, filed on May 17, 2012.

(51) Int. Cl.

| | |
|---|---|
| *F21K 9/27* | (2016.01) |
| *F21K 9/272* | (2016.01) |
| *F21Y 115/10* | (2016.01) |
| *F21Y 103/10* | (2016.01) |
| *F21W 131/406* | (2006.01) |
| *H02M 1/12* | (2006.01) |
| *H02M 7/538* | (2007.01) |

(56) References Cited

U.S. PATENT DOCUMENTS

| | | | |
|---|---|---|---|
| 7,192,160 B2 | 3/2007 | Reiff, Jr. et al. | |
| 7,290,893 B2* | 11/2007 | Amphlett | G03B 15/03 362/11 |
| 7,744,242 B2 | 6/2010 | Kramer | |
| 8,511,851 B2 | 8/2013 | Van de Ven et al. | |
| 8,783,901 B2 | 7/2014 | Zoorob et al. | |
| 9,719,642 B1 | 8/2017 | Macias | |
| 9,845,924 B1 | 12/2017 | Macias | |
| 2003/0072156 A1* | 4/2003 | Pohlert | G03B 15/02 362/244 |
| 2010/0102729 A1* | 4/2010 | Katzir | H05B 33/0803 315/113 |
| 2010/0289428 A1* | 11/2010 | Frazier | F21V 23/0442 315/294 |
| 2010/0315001 A1* | 12/2010 | Donnagala | F21K 9/27 315/51 |
| 2011/0043137 A1 | 2/2011 | Negley et al. | |
| 2012/0051042 A1 | 3/2012 | Artsyukhovich et al. | |

OTHER PUBLICATIONS

Weinert, Jonathan, LED Lighting Explained, entire book (total 68 sheets), 2010, by Philips Solid-State Lighting Solutions, Inc., Burlington, MA (USA).
Crockett, Will, Color Correction Guide, v3.4, 10 pages, accessed Nov. 20, 2018, downloaded from http://www.photoethnography.com/ClassicCameras/manuals/MinoltaColorMeterII/CCguide34.pdf, Arroyo Grande, CA (USA).
Brown, Blain, Cinematography Theory & Practice, Cover page, copyright page and p. 100 (3 sheets total), 2015, by Routledge, New York, NY (USA).
Butkus, M., Online Manual for Minolta Color Meter II, 20 pages, accessed Nov. 20, 2018, downloaded from https://www.butkus.org/chinon/minolta/minolta_color_meter_ii/minolta_color_meter_ii.htm, by M. Butkus, High Bridge, NJ (USA).
Official Action dated Oct. 17, 2018, Reexamination No. 90/014,146, filed May 30, 2018 (47 pages).
Official Action dated Nov. 21, 2018, Reexamination No. 90/014,150, filed Jun. 12, 2018 (45 pages).
Kris Malkiewicz and M. David Mullen, "Cinematography," published 2005, 5 pages.
U.S. Department of Energy, "Solid-State Lighting Technology Fact Sheet," Jan. 2012, 4 pages.
Richard Comerford, 1'LED Specs—Understanding the Color White, May 10, 2011, 4 pages.
Cree, "LED Color Mixing: Basics and Background," App. Note: CLD-AP38-Rev. 0, 2010, 27 pages.
Steven Keeping, "Whiter, Brighter LEDs," Aug. 30, 2011, 6 pages.
Steven Keeping, "Defining the Color Characteristics of White LEDs," Apr. 23, 2013, 6 pages.
Official Action dated Oct. 17, 2018, U.S. Pat. No. 9,719,642 to Macias, Reexamination Proceeding, 47 pages.
Reexamination Decision on Request dated Jul. 24, 2018, U.S. Pat. No. 9,845,924, Reexamination Proceeding, 27 pages.
Declaration of Frieder Hochheim in Support of Ex Parte Reexamination of U.S. Pat. No. 9,719,642, dated May 14, 2018, submitted in Reexamination Control No. 90/014,146 (13 pages).
"MacAdam Ellipses: What are MacAdam Ellipses or color ovals?" Osram Sylvania, Westfield, IN, 2000 (2 pages).
Cree, "Cree LED Components Overview," by Cree, Inc., Durham, NC, 2013, 301 pages.
U.S. Appl. No. 61/195,785, filed Oct. 10, 2008, Katzir, Wesley and Katzir, Omer, 62 pages.
"Color Quality of White LEDs," US Department of Energy (DOE), Washington, DC, Jan. 2008, 2 pages.
"Cree XLamp XHP35.2 LEDs Product Family Data Sheet," Cree, Inc., Durham, NC, 2018, 26 pages.
Minolta Color Meter IIIF manual, Minolta, Osaka, Japan, as posted Feb. 11, 2006 at www.butkus.org, 32 pages.
"Solid State Lighting Standards Update," Cree, Inc., Durham, NC, 2011, 29 pages.
"Industry News NEMA Publishes SSL Mar. 2011 High-Power White LED Binning for General Illumination," Light Directory, Oswego, IL, Mar. 31, 2011, 3 pages.
"NEMA publishes white-LED binning standard (SSL Mar. 2010)," LEDs Magazine, Tulsa, OK, Apr. 15, 2010, 2 pages.
Box, Harry C., Set Lighting Technician's Handbook, Fourth Edition, 2010, by Focal Press, Burlington, MA (USA), "Appendix I Gels and diffusions" (Table I.9), p. 544 (1 sheet total).
Operating Manual for Sekonic Prodigi Color C-500R/C-500, Sekonic Corporation, Tokyo, Japan, 2007, 57 pages.
"How LEDs Produce White Light," PhotonStar Lighting, hftp://www.photonstartechnology.com/learn/how_leds_produce_white_light, Accessed Oct. 22, 2018, 4 pages.
"The Craft of Lighting: Using Gels," School Video News, Inc., http://schoolvideonews.com/Lighting/The-Craft-of-Lighting-Using-Gels, Accessed Oct. 14, 2018, 4 pages.
"LED lighting with incandescent spectrum?," Electrical Engineering Stack Exchange, https://electronics.stackexchange.com/questions/20757/led-lighting-with-incandescent-spectrum, Accessed Dec. 21, 2018, 5 pages.
"What You Need to Know About Continuous Lights and Their Color Paradox," Emerald Expositions, LLC, https://www.pdnonline.com/gear/techniques/video-filmmaking/need-know-continuous-lights-color-paradox/, Jul. 28, 2017, 8 pages.
Henry Tran, UPSTO, Ex Parte Reexamination Decision on Request, Reexamination Control No. 90/014,150, Jul. 24, 2018, 27 pages.
Henry Tran, USPTO, Office Action in Ex Parte Reexamination, Reexamination Control No. 90/014,150, Nov. 21, 2018, 45 pages.
Henry Tran, USPTO, Notice of Intent to Issue a Reexam Certificate, Reexamination Control No. 90/014,150, Apr. 2, 2019, 11 pages.
USPTO, Reexamination Certificate Issued, May 7, 2019, 4 pages.
Houston Neal, Are LED Fluorescent Tubes Ready for Prime Time?, May 7, 2010, 5 pages.
Cree XLamp XP Data Sheet (CLD-DS20 Rev.613), 2009-2011, 12 pages.
Cree XLamp MK-R LEDs Data Sheet (CLD-DS60 Rev. A) 2012, 19 pages.
Colt LED website selected pages, Authorized Distributors, 2019, 2 pages.
Answer to Amended Complaint, Case No. 2:17-CV-07325 AB, Feb. 23, 2018; 21 pages.
Kino Flo, 1994 Fluorescent Lightning System Catalog, 1994, 3 selected pages.
B&M Lighting & Universal Studios Partner on Mac Tech LED Lighting, Jun. 3, 2011, 3 pages.
Mike Wood, When White Light Isn't White, Spring 2008, 5 pages.
Steven Keeping, Identifying the Causes if LED Efficiency Droop, Oct. 10, 2011, 5 pages.
Steven Keeping, What's Next for High-Power LEDs?, Dec. 4, 2012, 8 pages.
USPTO, Reexamination Certificate Issued, Jul. 29, 2019, 4 pages.

(56) References Cited

OTHER PUBLICATIONS

Declaration of Frieder Hochheim in Support of Second Request for Ex Parte Reexamination of U.S. Pat. No. 9,719,642, Reexamination Control No. 90014371, Aug. 29, 2019, 8 pages.
Declaration of Steven Strong in Support of Second Request for Ex Parte Reexamination of U.S. Pat. No. 9,719,642, Reexamination Control No. 90014371, Aug. 30, 2019, 6 pages.
Declaration of Raymond Wolffe in Support of Second Request for Ex Parte Reexamination of U.S. Pat. No. 9,719,642, Reexamination Control No. 90014371, Aug. 30, 2019, 6 pages.
Request for Ex Parte Reexamination of U.S. Pat. No. 9,719,642, Sep. 4, 2019, 86 pages.
Declaration of Frieder Hochheim in Support of Second Request for Ex Parte Reexamination of U.S. Pat. No. 9,845,924, Reexamination Control No. 90014372, Aug. 29, 2019, 8 pages.
Declaration of Steven Strong in Support of Second Request for Ex Parte Reexamination of U.S. Pat. No. 9,845,924, Reexamination Control No. 90014372, Aug. 30, 2019, 6 pages.
Declaration of Raymond Wolffe in Support of Second Request for Ex Parte Reexamination of U.S. Pat. No. 9,845,924, Reexamination Control No. 90014372, Aug. 30, 2019, 6 pages.
Request for Ex Parte Reexamination of U.S. Pat. No. 9,845,924, Sep. 4, 2019, 87 pages.
John M. Hotaling, II, UPSTO, Order Granting Request for Ex Parte Reexamination, Reexamination Control No. 90/014,146, Jun. 218, 2018, 15 pages.
John M. Hotaling, II, USPTO, Office Action in Ex Parte Reexamination, Reexamination Control No. 90/014,146, Oct. 17, 2018, 47 pages.
John M. Hotaling, II, USPTO, Ex Parte Final Action, Reexamination Control No. 90/014,146, Mar. 27, 2019, 58 pages.
John M. Hotaling, II, USPTO, Notice of Intent to Issue a Reexam Certificate, Reexamination Control No. 90/014,146, May 23, 2019, 7 pages.
Order Granting Reexamination Request, Control No. 90/014,371, USPTO, Oct. 8, 2019, 21 pages.
Order Granting Reexamination Request, Control No. 90/014,372, USPTO, Oct. 16, 2019, 19 pages.
USPTO, Requestors Petition for Review of Examiners Determination on Request for Reexamination Filed Under 35 USC 302, by Craig Bailey, Reexamination No. 90/014,371, Nov. 8, 2019, 17 pages.
USPTO, Requestors Petition for Review of Examiners Determination on Request for Reexamination Filed Under 35 USC 302, by Craig Bailey, Reexamination No. 90/014,372, Nov. 8, 2019, 18 pages.

* cited by examiner

TUBE LIGHT WITH IMPROVED LED ARRAY

CROSS REFERENCE TO RELATED APPLICATION

This utility application is a continuation of U.S. patent application Ser. No. 15/818,306, filed Nov. 20, 2017, which claims the benefit of U.S. patent application Ser. No. 15/450,372, filed Mar. 6, 2017, now U.S. Pat. No. 9,845,924, which claims the benefit of U.S. patent application Ser. No. 13/896,868, filed May 17, 2013, now U.S. Pat. No. 9,719,642, which claims the benefit of U.S. Provisional Application No. 61/648,554, filed on May 17, 2012 incorporated by reference herein.

BACKGROUND

Field of the Invention

The present invention relates to a lighting system comprising a tube light with an improved LED array capable of producing light within at least two desired predetermined color temperature ranges.

Description of the Related Art

Fluorescent light bulbs or lamps have been used for a long time for various artificial lighting purposes, from residential to commercial lighting. Fluorescent lamps are gas-discharge lamps that use electricity to excite mercury vapor to produce short-wave ultraviolet light that then causes a phosphor to fluoresce, producing visible light. Many fluorescent bulbs are made in tubular form which contains the mercury vapor. As a result, larger fluorescent lamps require large elongated tube lamps to produce the desired amount of light.

While larger fluorescent lamps have been used mostly in commercial buildings or institutional buildings, they also have applications in the lighting industry such as TV, stage, auditorium, and/or film studio use, and/or other venues. However, fluorescent lamps must be used with caution in the lighting industry as the color temperature of fluorescent lamps may create unwanted visual effects for the viewer. Color temperature is a characteristic of visible light measured by the temperature of an ideal black body radiator that radiates light of comparable hue to that of the light source. Color temperature is conventionally stated in the unit of absolute temperature, Kelvin (K). Color temperatures over 5,000K are considered "cool" colors (blue-ish white), while lower color temperatures of 2,700 to 3,300 are considered "warm" colors (yellowish white through red).

The spectrum of light emitted from a fluorescent lamp is the combination of light directly emitted by mercury vapor, and light emitted by the phosphorescent coating. The spectral lines from the mercury emission and the phosphorescence effect give a combined distribution of light that is different from those produced by incandescent sources. Colored objects are perceived differently under light sources with differing spectral distributions. For example, some people find the color rendition produced by some fluorescent lamps to be harsh and displeasing, sometimes giving a greenish hue to skin tones giving people a sickly or unhealthy appearance. In addition, when used for lighting TV, studio, or film productions, the color temperature of the lighting often may need to be changed in order to match the scene or mood of the production. For example, recreating a scene taking place under sunlight with blue skies may require a color temperature of 9000 to 12000 Kelvin (K), while a scene taking place at sunrise or sunset may require a lighting color temperature of 3200 K. The two most frequently used and desired color temperature ranges in the lighting industry for stage and set lighting have been found to be 3050 to 3300 K for tungsten (warm white), and 5400 to 5600 K for daylight white. These ranges represent ideal color temperature ranges for producing ideal lighting for TV, photography and film studio scenarios.

In such uses where accurate and suitable lighting color temperature is vital, lighting "gels" are often used in conjunction with fluorescent lamps to produce the desired color temperature. These lighting gels often consist of colored tube shaped sleeves made from a semi-transparent material to give the light the desired color effect. Although allowing for modification of the color temperature of light, techniques such as using color gels do not provide an easy method to change the lighting and so cause significant delays in production. For example, if shooting a daytime scene, production workers would need to manually remove and replace all of the colored gels on the fluorescent lamps being used, often a daunting task when faced with several banks of lamps, each bank consisting of numerous individual fluorescent lamps. Or without colored gels, a lighting crew must continually change the fluorescent lamps between daylight white (or day white) colored lamps and tungsten (or warm white) colored lamps, or if desired, other types of white/light colored lamps.

Alternatively, LED (light emitting diode) lighting has been developed and has recently gained popularity. Since LEDs use very little energy and have a relatively long life, in recent years it has been popular to replace existing fluorescent bulbs with LEDs. LEDs present many advantages over incandescent or fluorescent light sources including lower energy consumption, longer lifetime, improved physical robustness, smaller size, and faster switching. There are two primary types of LED lighting used to create white light. One is to use individual LEDs that emit three primary colors (red, green, and blue) and mix the colors to form white light. The other is to use a phosphor material to convert monochromatic light from a blue or ultraviolet LED to broad-spectrum white light, also referred to as phosphor based LEDs.

In order to match the tubular form of a fluorescent bulb, arrays of LEDs may be placed within a tube having the same form factor as a fluorescent lamp, such as a T8 or T12 size fluorescent bulb. One such bulb is made by Dialight and is called DuroSite™. For example, in size T8, the bulb in one form uses SMD LEDs in a four foot long tube and provides 1500 Lumens of Natural White light, using 17 Watts, 300 LEDs, with 90V-277V, and is ETL/UL Approved. However, such existing products cannot provide a lighting solution to create two different predetermined color temperature light outputs suitable for use in the stage lighting industry, for uses such as TV, stage, photography and studio lighting. Sufficient intensity of the light is preferably at least 1000 lux for such an application.

In U.S. Pat. No. 8,203,260 to Li et al discloses an LED light made in a form factor of a fluorescent light and having color temperature which is tunable by blending adjacent pairs of LEDs by dimming one or both LEDs a customized amount to achieve the desired color. The control is complex and the temperature of the cold light is relatively high. The lighting is intended for street lights, vehicle headlights, and/or for other lights subject to moisture, fog, dust or smoke situations. Therefore, a fog or moisture sensor or other sensor is preferably used with the device. Since the drive current to each of the different color LEDs must be reduced to achieve the desired blend of light, the intensity is not only reduced but is expected to vary quite a bit from color to color. There is no single source mode, and the light output is not suitable for studio use.

What is desired is a lighting solution suitable for the lighting industry implementing the advantages of LED lights which allows for evenly dispersed light controllable within specific color temperature parameters without the need to physically switch out colored gels or lamp modules to achieve the desired color temperature light. It is also desirable to maintain the shape and interface of a traditional fluorescent lamp so as to allow maximum usability in the lighting industry without requiring expensive and time consuming equipment overhaul and upgrades.

SUMMARY OF THE INVENTION

Exemplary embodiments of the invention include apparatus and system for producing light using LED lighting with outputs of two predetermined desired color temperatures. In a preferred embodiment, an LED light system includes a tubular LED lamp having substantially the same physical form as a traditional fluorescent lamp tube. The term "LED lamp" or "bulb" as used herein refers to a unitary light module construction utilizing LEDs with a physical shape and form the same as or substantially similar to a traditional fluorescent lamp tube.

A preferred embodiment further includes a plurality of LEDs arranged in a matrix formation on a surface provided within the LED lamp. The term "LEDs", as used herein refers to a single light source utilizing LED lighting technology, including a single LED unit, as well as a single grouping consisting of trichromatic LED units configured and arranged to work together to produce a single color (for example, a grouping of red, green, and blue LED bulbs configured to create white light.)

In the preferred embodiment, the LEDs may be arranged in arrays of four bulbs or lamps preferably in a tube in one direction perpendicular to a main axis of the tube and facing in one direction, by many rows of such LEDs, e.g., at least four rows (for a total of sixteen LEDs). A preferred embodiment may include at least ten or twenty rows of LED arrays, or even twenty-five or more rows (equaling 100 or more LEDs). The number of rows may vary depending on the size of the LED lamp used for the lighting fixture. For example, in a three foot long tube there will be fewer LEDs than a four foot long tube light device, in a linear variance given the same diameter and number of LEDs in each LED array.

A preferred embodiment has a mixture of at least two types of LEDs interspersed in one matrix arrangement. A first type of LED may be configured to produce light in a first predetermined color temperature range, and a second type of LED may be configured to produce light in a second predetermined color temperature range. In the preferred embodiment, the first predetermined color temperature range extends between 5400 and 5600 K for rendering daylight color temperature, and the second predetermined color temperature range extends between 3050 and 3300 K for rendering tungsten color temperature light. The color ranges may be predetermined based on the desirable appearance of a person's skin during commercial video or image recording.

The first and second types of LEDs are preferably arranged within the matrix in a checkerboard pattern, a row of LEDs alternating between the first type and the second type of LEDs. Another preferred embodiment may include various other uniform arrangements having dispersed and/or arrayed patterns of the two types of LEDs within the matrix. In all embodiments, the arrangements of the two types of LEDs are predetermined such that the grouping of the first type of LEDs and the grouping of the second type of LEDs each provide an evenly dispersed light. Maximum driving current to each of the first type of LED, when the LED bulb is on (all first type of LEDs are lit), is preferably the same or substantially the same as driving current to each second type of LED when the second type of bulb is on (all second type of LEDs are lit).

Preferably the intensity output is at least about 1000 lumens. A preferred embodiment may also include a first driver and a second driver for providing driving currents to trigger the first and second types of LED bulbs respectively. The system may also include a controller connected to the at least two drivers for generating a plurality of output signals and outputting the output signals to the drivers in response to a predetermined setting by the user. In another embodiment, there are multiple lamps for stage or set lighting. In a further embodiment, there is a control unit for selectively turning on and off the lamps and, preferably, for selectively dimming and for selecting between the first and second type of LEDs, e.g., daylight white light and tungsten (warm white light).

Because the lamps are LEDs, no ballast is needed.

DESCRIPTION OF EXEMPLARY EMBODIMENTS

In general, various embodiments of the invention relate to LED lighting systems configured to produce at least two different ranges of color temperature light, utilizing a first type of LED bulbs configured to provide a first color temperature range light and a second type of LED bulbs configured to provide a second color temperature range light. The invention is contemplated to be used in conjunction with lighting fixtures and infrastructure traditionally used in conjunction with fluorescent light tube lamps. Additionally, exemplary embodiments of the invention include a controller and a control interface box through which an operator is able to control the output signal output to the drivers of the LEDs. Alternatively, the LED lamp may include a switch determining the grouping of LEDs powered by the voltage, controllable by the user via the control interface box. In yet another embodiment, the user may be able to dim the output signal to the first type of LEDs and second type of LEDs. Preferably, the first type of LEDs are daylight white and the second type of LEDs are tungsten or warm white light.

Figure 1A:
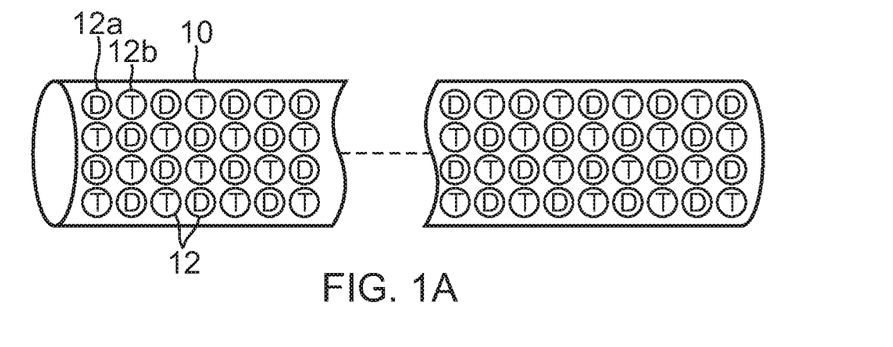
FIG. 1A is a schematic view of a bulb in accordance with one embodiment, showing a matrix arrangement of daylight and tungsten LEDs.

Turning now to FIG. 1A, a schematic diagram of LEDs are shown positioned in a matrix arrangement on a circuit board for use in a LED lamp or bulb in an embodiment of the present invention. There is a support structure 10 configured to receive and retain a plurality of LEDs 12 in a uniform and consistent position. The support structure 10 is preferably an elongated and narrow surface shaped to insert into a tubular transparent or diffusor shade such that the lamp construction is compatible with existing fixtures for traditional fluorescent lamp tubes. The LEDs 12 are positioned in a uniform and consistent directional position, and positioned in a matrix arrangement such that each LED is located equidistantly apart from surrounding LEDs 12. The support structure may be or may include a printed circuit board configured to connect a power source to the LEDs.

The preferred embodiment includes a first group of LEDs 12a (marked with D, for daylight white), and a second group of LEDs 12b (marked with T, for tungsten light), located on a surface of support structure 10. The D LEDs are configured to produce a light with color temperature in the range of 5400 to 5600 K (or about 5400 to 5600K) for daylight white light. The T LEDs are configured to produce a light with color temperature in the range of 3050 to 3300 K (or about this range) and most preferably 3200K or about 3200K for warm white light. Additional ranges that may be acceptable are 2800K to 3300K and 5000K to 5600K, but the above are more preferred About means within 3 percent.

These ranges have been tested and used in numerous productions, and have been determined to be the preferred desired color temperature ranges for shooting television and film productions utilizing daylight and tungsten lighting to recreate day time and dusk/night time scenes.

In the embodiment as shown in FIG. 1A, the D and T LEDs may be arranged in an alternating checkerboard pattern to provide an even distribution of light on the subject. This arrangement is preferred to create an even lighting cast even when only one grouping of LEDs s being used at any given time. In the preferred embodiment, the circuit board of the LED lamp 8 (FIG. 2) is configured such that only one group of LEDs 12 can be turned on at a time. The D LEDs 12a and the T LEDs 12b are exclusively operated to produce either the daylight white lighting with the D bulbs, or the warm white lighting with the T bulbs. Since only one group of bulbs can be on at a single time, the arrangement of the two groups of LEDs may have a direct impact on the quality of the light produced by the LED lamp. Therefore, it may be advantageous to arrange the D and T bulbs in a consistently inter-dispersed matrix configuration as shown in FIG. 1A to produce the highest quality, evenly cast lighting.

Figure 1B:
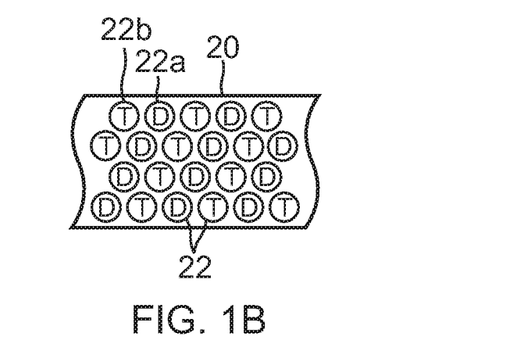
FIG. 1B is a schematic view of a bulb in accordance with another embodiment, showing a diagonally alternating arrangement of daylight and tungsten LEDs.
Figure 1C:
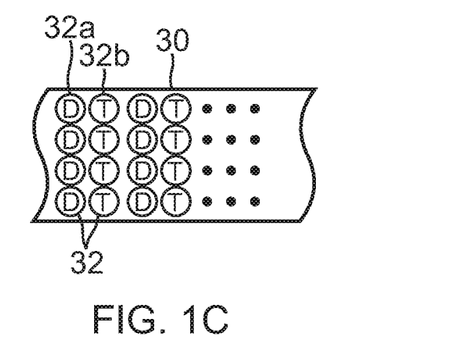
FIG. 1C is a schematic view of a bulb in accordance with an additional embodiment, showing an alternating arrangement of columns of daylight and tungsten LEDs.

In another embodiment, it may be desirable to create lighting effects with more directional light or harsher light wherein the LEDs of the D or T groups are not inter-dispersed, but positioned closer together within a single group. FIG. 1B shows an embodiment depicting LEDs 22 on support 20. D LEDs 22a and T LEDs 22b are in an alternate diagonally alternating arrangement of D and T LEDs, and FIG. 1C shows yet another embodiment depicting LEDs 32 on a support 30 having grouped alternating arrangement of columns of D and T LEDs 32a, 32b, respectively.

Figure 1D:
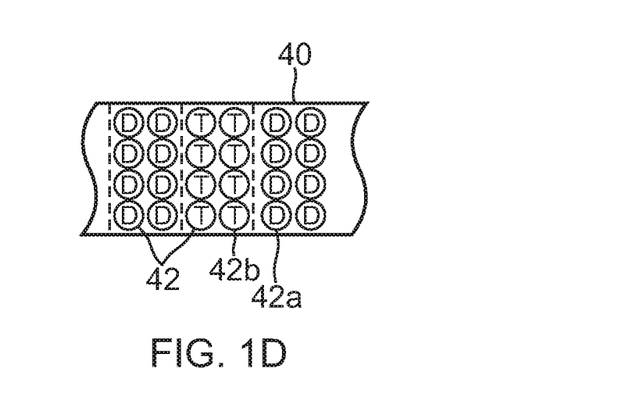
FIG. 1D is a schematic view of a bulb in accordance with a further embodiment, showing an alternating arrangement of groups of daylight and tungsten LEDs.

FIG. 1D shows a support 40 having LEDs 42 in alternating groups of columns of D LEDs 42a and T LEDs 42b. The LED arrangements are not limited to these embodiments and can vary based on the desired lighting effect for the particular use or scene being lit, but most preferably are individually alternating.

Figure 2:
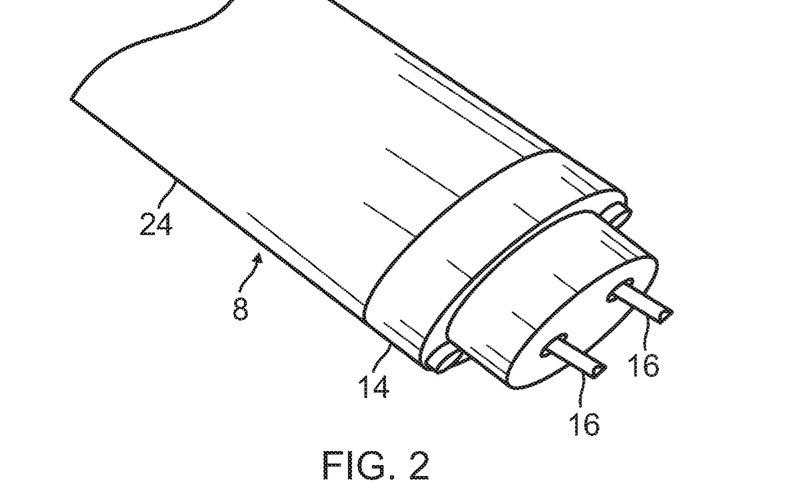
FIG. 2 is a perspective view of a portion of a bulb of the present invention.

FIG. 2 is a perspective view of a portion of LED lamp 8, which is similar to a traditional fluorescent lamp tube. Each end of the LED lamp 8 includes a base 14 which includes electrical connectors 16. This embodiment is configured with dimensions equivalent to a "T8" size traditional fluorescent tube, which is one inch in diameter, or a T12 size (one and a half inch diameter). The base 14 and connectors 16 are configured to be compatible with traditional fluorescent lighting fixtures and mounts such that the LED lamp 8 may be installed into existing lighting fixtures (such as shown in FIG. 4A).

A clear or semi-translucent or translucent diffusor shade tube 24 is also visible which acts to diffuse the light produced by the LEDs of the LED lamp. In the preferred embodiment, tube 24 is configured and sized with the same diameter as a traditional fluorescent tube lamp, such as a size T8 or T12. There may be various embodiments with varying tube diameters configured with the same diameter and dimensions of various other traditional fluorescent lamp sizes.

Figure 2A:
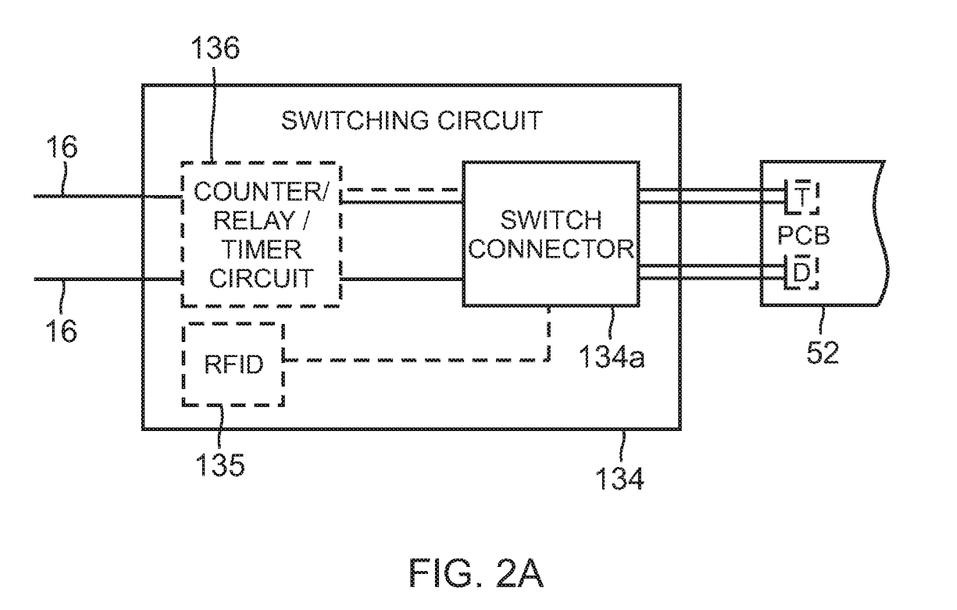
FIG. 2A is a schematic view of various alternative switching mechanisms in accordance with an embodiment of the present invention.

FIG. 2A is a schematic view of various alternative switching mechanisms in accordance with an embodiment of the present invention. Switching mechanism 134 shows various options for switch 34. It may be a manual switch such as manual switch 34a (see FIG. 4) or it may be a remote controlled switch having an RFID (radio frequency identification detector) 135 or infrared (IR) to receive remote controls to cause actual switch connector 134a to toggle between allowing current to drive the T LEDs or the D LEDs on circuit board 52 (PCB). Signals could also travel along the electrical connectors 16 by means of modulating an initial portion of the electrical power carried to connectors 16 (from, e.g., a control unit as in FIGS. 5 and 6). The modulated signal could be a certain pulsing of power on and power off in an initial period of turning on the switch to send power to the lamp, e.g., two pulses, for switching to the T LEDs and e.g., four pulses, for switching to the D LEDs. The switches on the control unit could be three way switches, enabling selection between D LEDs on, T bulbs on, and no light, or two way switches enabling selection between D LEDs on and T LEDs on, and using a master power switch to switch off the lamp. The control unit in this case would include circuitry to provide the modulated power on signal. When a counter/relay/timer circuit receives the pulses, it signals the switch connector 134a to move to the appropriate position to power the T LEDs or D LEDs. Alternatively, the control unit may send separate control signals along a multipin connector, and the LED lamp switching circuit may be a microprocessor or the like for receiving the signals and performing the switching function. In such a case, a standard fluorescent receiver and the leads into the bulb may be modified to send and receive appropriate control signals in addition to current.

Figure 3:
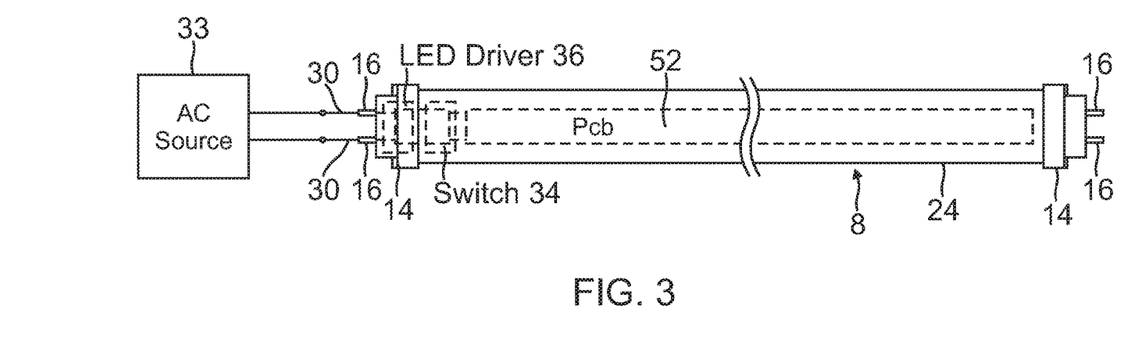
FIG. 3 is a schematic view of a bulb of the present invention.

FIG. 3 is a schematic view of an LED lamp of FIG. 2 in more detail. Representations of the LED lamp 8, base 20, connectors 16, and connector wires 30 are shown. An AC (or DC) power source 33 such as an electrical grid, battery, or generator may be connected to the connector wires to provide power to the LED lamp 8. This embodiment may also include at least one LED driver 36 configured to provide appropriate power input to the various LEDs of the first and second types, respectively, depending on and in response to a switch 34. LED lamp 8 may include two LED drivers 36, a first driver to provide appropriate power input to the D LEDs, and a second driver to provide appropriate power input to the T LEDs.

In another preferred embodiment, the driver or drivers 36 are configured to provide dimmable control over the LEDs of the LED lamp. The LED lamp 8 may include the power input switch 34 configured to selectively provide power to either the grouping of D LEDs or the grouping of T LEDs. Preferably, the grouping of LEDs to be powered at a given time by the power source may be selected by the user. Also preferably, each lamp or bulb 8 may have arrayed LEDs on each side of support 10 (or 20, 30 or 40).

Figure 4:
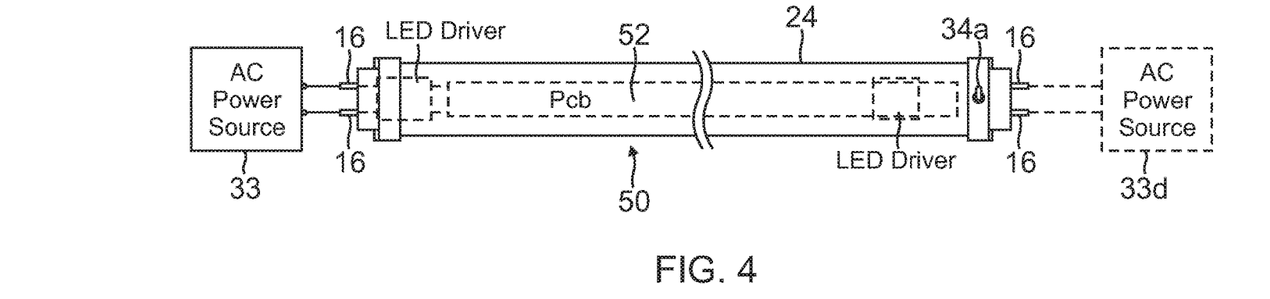
FIG. 4 is a schematic view of another embodiment of the present invention.
Figure 4A:
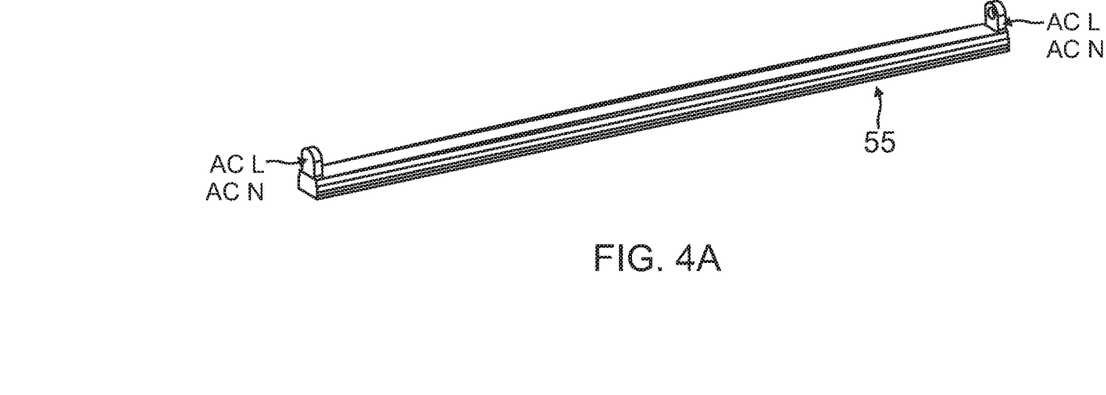
FIG. 4A is a view of a fluorescent bulb receptacle which may be used with a bulb of the present invention.

In an alternate embodiment as shown in FIG. 4, the LED lamp may include two sets of connectors 16, one set on each end of the LED lamp. One set of connectors may be electrically connected to provide power to one grouping of LED bulbs, and another to provide power to the other grouping. Each connector may be powered by distinct power sources. In another configuration, a power input switch 44 external to the LED lamp may be controllable by the user to selectively provide power to the desired grouping of LEDs. In an embodiment, the LED lighting system may include a wiring connector having at least sixteen pins, two of the pins being connected to the support structure to supply power to the first grouping of LEDs and the second grouping of LEDs. In the preferred embodiment, the LEDs are electrically connected to a power source by a printed circuit board (Pcb) 52.

As shown in FIG. 4A, there is a fluorescent bulb receptacle 55 in which bulb 8 may be placed to connect to a power source in the same manner as a fluorescent bulb would be placed therein.

In FIG. 4, there is an LED lamp 50 in an embodiment of the present invention. The lamp has multiple, e.g., four, LED lamps 57, 59, 61 and 63, each having LEDs in a matrix arrangement. LEDs 52 are positioned on a printed circuit board 54 (PCB) in a matrix arrangement. Two types of LEDs are utilized: there is a first group of LEDs configured to provide light with a color temperature between a predetermined range of 3050 and 3300 K, and a second group of LEDs configured to provide light between a predetermined range of 5400 to 5600 K. The two groups of LEDs are preferably arranged in an alternating matrix arrangement across the PCB as in FIG. 1A or may also be as in FIG. 1B, 1C or 1D. In an embodiment, the PCB is connected to sets of connectors on both ends of the PCB. In another embodiment, only one set of connectors is provided on one end of the PCB.

Each LED lamp 50 includes a clear, translucent or semi-translucent diffusor shade tube 24 configured to sleeve over the PCB and the LEDs. Preferably, the diffusor shade tube 24 is configured with the same size and dimensions as traditional fluorescent tube lamps, such as the T8 size (one inch diameter or if T12 then one and half inch diameter, etc.). The diffusor shade tube 24 may be constructed from glass or durable plastic with a white or neutral gray coloring so as to not affect the predetermined color temperature of the LED bulbs.

Figure 5:
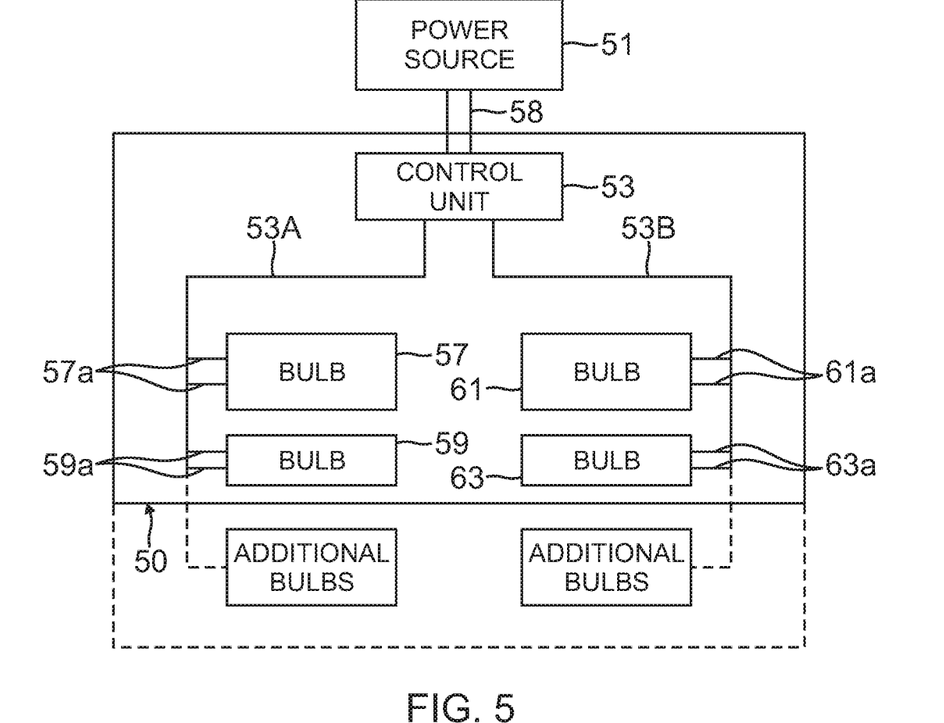
FIG. 5 is a schematic view of an LED lamp system in an embodiment of the present invention.

In FIG. 5, there is an LED lamp system 50 of the present invention. There is a power source 51 such as 110V AC current at 50 or 60 Hz. The power source is connected to control unit 53. From control unit 53, one or multiple cords or connectors 53A, 53B such as 16 pin connectors electrically connect the power source with the LED lamps 57, 59, 61, 63, such as if FIG. 3 or 4 with LED patterns such as in FIG. 1A or FIG. 1B, 1C or 1D. Specifically, the electrical wires in the connectors connect to leads 57a, 59a, 61a and 63a, respectively. Additional lamps may be connected as well, e.g. four per sixteen pin connector.

The drivers for each bulb could be connected to separate leads for each type of LED (D or T). More preferably, so that a fluorescent bulb receiver (e.g. receiver 55 of FIG. 4A) need not to be modified, the driver may include circuitry (e.g. a relay or series of relays or a counter or other controller) to toggle between the D LEDs and the T LEDs when the power is on. A simpler way is to have a switch, manual or remote control such as switch 34 or 34a of FIG. 3 that toggles between powering the D bulbs and the T bulbs. Lamp system 50 may be configured to be compatible or similar to traditional fluorescent tube lamp fixtures. Control unit 53 is controllable by the user to selectively provide power from power source 51 to a desired grouping of LED lamps or bulbs (57, 59 or 61, 63). In these embodiments, a manual switch (such as 34 or 34 or remote control or driver control) may be mounted on the support structure configured to enable selective operation of either the first type LEDs (D) or the second type LEDs (T).

Figure 6:
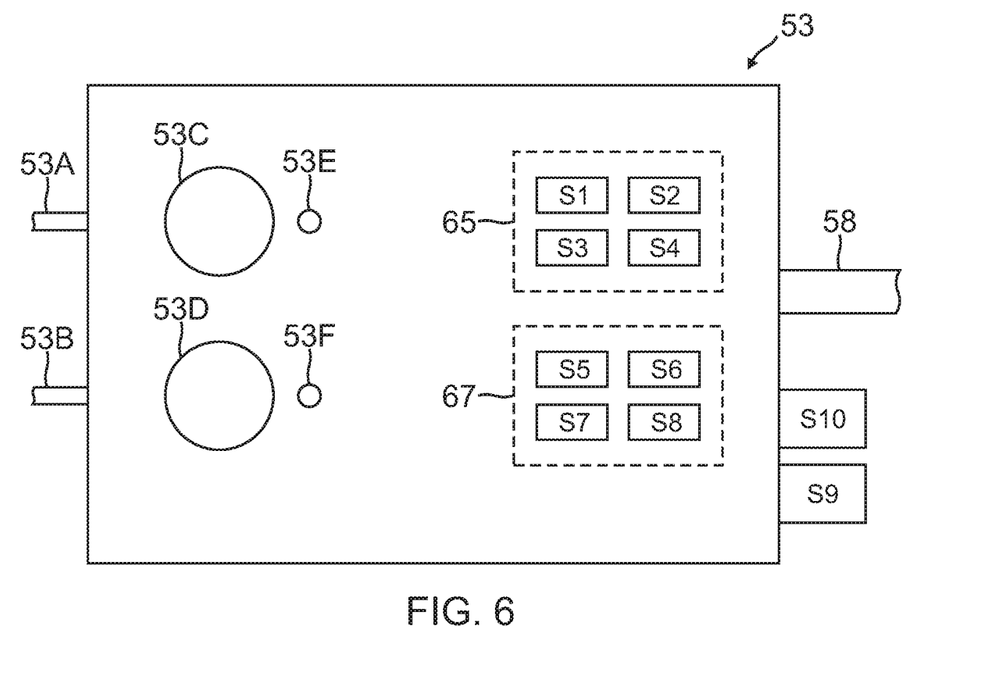
FIG. 6 is a perspective view of a control box of an embodiment of the present invention.

FIG. 6 is a schematic view of control unit 53 of the present invention. The control unit may include toggle switches S1 to S8 for controlling power input to the LED lamps 57, 59, 61, 63 and any additional bulbs (e.g., two more per each cable 53A, 53B) connected to the control unit. The control unit may be configured and connected such that each switch may control one or a predetermined grouping of LEDs for one specific LED lamp of the present invention, toggling between an "On" and "Off" position for that particular grouping of LED bulbs. Alternatively, each switch may control a plurality of the same LEDs grouping across a plurality of LED lamps in a bank of lights. For example, switch S1 may control the On/Off toggle of D color temperature LEDs for a bank of lights comprising two, four or more LED lamps, and switch S2 may control the On/Off toggle of T color temperature LEDs for the same two, or four or more LED lamps.

In another preferred embodiment, each switch (e.g. S1) may be configured to simply control the power switch of the LED lamp to selectively provide power to the D or T grouping of LEDs of the LED lamps. In this configuration, the user is unable to toggle between an On/Off power configuration to a particular LED lamp, but instead is able to simply control the specific grouping of LEDs being powered at any particular point in time. Additionally, control box 60 may include dimming switches 53C, 53D or knobs to control the power gain levels to the LED lamps to vary the brightness or LEDs and control lumens from the LED lamp. A power-on LED indicator 53E and 53F may be included for each bank of switches 65, 67, respectively. There may also be a master power switch S10 and another master power switch S9 for each switch bank 65, 67, respectively.

The control unit may be connected to the LED lamps via a standard quick connect interface. The quick connect interface may be connected to the LED lamps via industrial cables widely used in the lighting and commercial production industry.

Spectrophotocolorimeter testing for an LED lamp of the present invention, maps color perception in terms of two parameters, x and y. The chromaticity coordinates map the color with respect to hue and saturation on the two-dimensional Commission Internationale de l'Eclairage (CIE) diagram. The testing of Daylight indicates that a light color temperature of 5000 K. The color rendering index (CRI) is indicated as Ra which has been found to be at least about 92 to 93 percent.

A CIE test of tungsten had a light color temperature of about 2800K to about 3000 K. The color rendering index is indicated as Ra being at least about 93 percent. Flux has been found to be about or over 1000 lumens.

Light systems of the present invention are suitable for TV or studio production.

Figure 7:
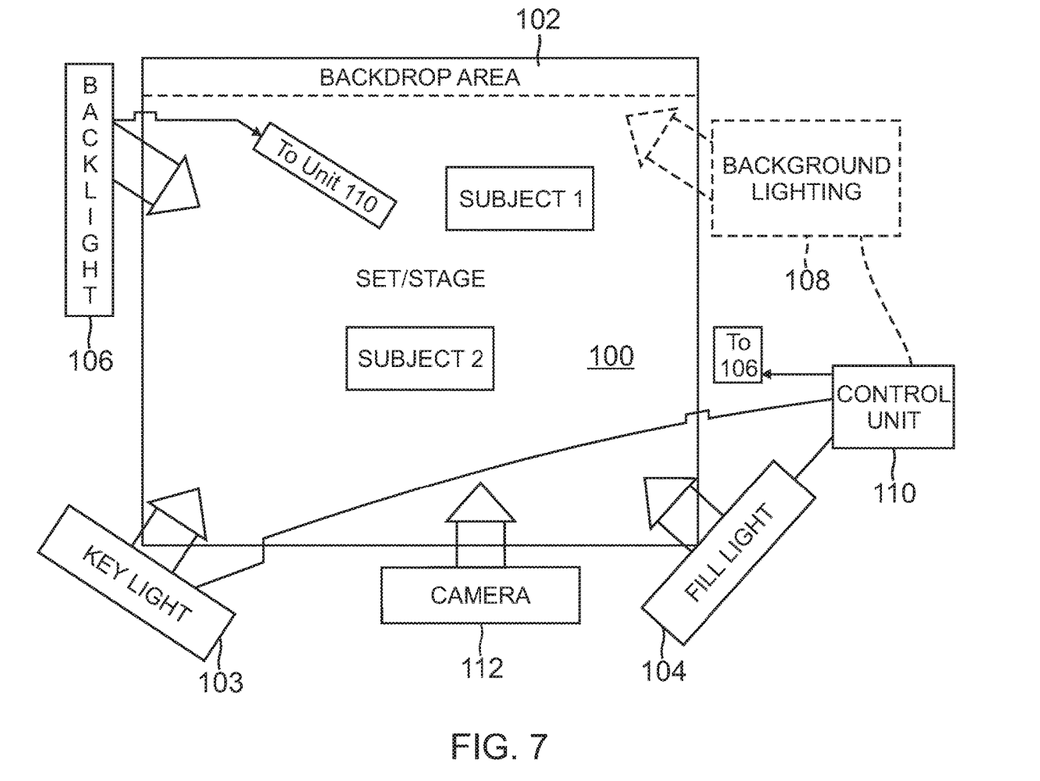
FIG. 7 is a schematic view of a stage and various LED lamps used for lighting a set in an embodiment of the present invention.

FIG. 7 is a diagram of the system of the present invention being used for a commercial production. The diagram depicts a scene being shot for commercial uses inside of a large studio or production warehouse. There is a set or stage 100, subjects 1 and 2 on stage (people), and a backdrop are 102. A plurality of LED fixtures 103, 104, 106 and 108 are provided and mounted to direct desired lighting on the stage or set of the production. Each LED fixture 90 may include a plurality of LED lamps, as in prior embodiments, e.g., a bank of four T8 or T12 size bulbs or other desirable size. Each group is configured to provide lighting within a predetermined color temperature range. In the diagram, the lighting provided by the LED lamps are selectively daylight white, with a color temperature between the range of 5400 to 5600 K, and tungsten or warm white with a color temperature range of 3000 to 3300K, using control unit (or units) 110, which may be the same as shown in FIGS. 5 and 6. Other temperature ranges as disclosed herein may be used.

Each of the LED lamps are connected to control unit 110 via cables. The cables may be standard cables and wiring widely used in the lighting and commercial production industry. The cables may range from 50 to 100 feet in length, and may be extended to lengths of up to 200 feet, depending on production requirements. In many cases, the standard cables and wiring may be preexisting cables previously used with traditional fluorescent or halogen studio lighting. The compatibility of the LED lamps and fixtures of the present invention allow for use with traditional infrastructure and cables already in place. The cables may be connected to the control unit via a quick connect interface, which may include a secure screw-in connection. The quick connect interface may also be a standard connection interface widely used in the industry with traditional lighting equipment, which may be reused with the current invention. The control unit is connected via a quick connect interface to a power source, such as a power grid, generator, or large capacity battery, as in prior embodiments.

In the diagram, subjects S1 and S2 are being filmed on a film camera 112 during a scene. To recreate daylight lighting, control unit 110 is used to turn on power to only the daylight white LED bulbs of the LED lamps, which produces daylight white light with color temperature in the predetermined range of 5400 to 5600 K. The light is directed to hit the subject(s) and bounce off to give a predetermined color temperature based on the subjects' skin tone, which is then captured by the camera 112, giving the desired appearance and effect on film.

EXAMPLES

Example 1

A four foot long T12 (1.5" diameter) LED lamp was constructed with four rows of alternating LEDs of a daylight type and tungsten (warm light) type, using the pattern of FIG. 1A. The power consumption is quite low for the light output.

| | |
|---|---|
| Color Temperature (Daylight Mode) | 5500 K ± 100° K |
| Color Temperature (Tungsten Mode) | 3200 K ± 150° K |
| CRI (color rendering index) | 90% + |
| Photo Color Correction (CC) Green | <5G |
| Photo Color Correction (CC) Magenta | <5M |
| Luminosity Daylight avg Lux/FC | 3 ft: 549/51 |
| | 5 ft: 289/27 |
| | 10 ft: 80/7.4 |
| | 15 ft: 40/3.7 |
| Luminosity Tungsten avg Lux/FC | 3 ft: 530/49 |
| | 5 ft: 230/21 |
| | 10 ft: 66/6 |
| | 15 ft: 30/2.8 |
| Power Consumption (@120 V/60 Hz) | 0.35 amp 42 watts |

Fluorescent lights range from a CRI (color rendering index) of about 50% for the basic types, up to about 90% for the best tri-phosphor type. The present invention can achieve a CRI as high or higher than expensive fluorescent lights.

Spacing of the LEDs may, e.g., be one quarter inch apart or about one quarter inch apart from the middle of one LED to the middle of the next one. It can be less and can be more as desired. For example, in a T12 bulb that is four feet long (1198 mm without the leads and 1213 mm with leads; by diameter of 41 mm), there would be four LEDs over the width and 144 LEDs long, for a total of 576 LEDs. Some of the four foot length of the bulb is taken up by the leads and end caps, driver and switch. The LEDs are preferably SMD 3528 (and/or SMD 2835 may be used or other suitable size) single color LEDs. Such LEDs may be about 3.5 mm by 2.8 mm, or very roughly about a ⅛ inch square.

Example 2

A four foot long T12 (1.5" diameter) LED lamp was constructed with four rows of alternating LEDs of a daylight type and tungsten (warm light) type, using the pattern of FIG. 1A. The power consumption is quite low for the light output. Other parameters are the same or substantially the same as in Example 1.

| | |
|---|---|
| Color Temperature (Day white Mode) | 5000 to 5500 K |
| Color Temperature (Warm white Mode) | 2700-3200 K |
| CRI (color rendering index) | > 91 |
| Photo Color Correction (CC) Green | < 5 G |
| Photo Color Correction (CC) Magenta | < 5 M |
| Luminosity Daylight (day white) avg | 1170 ± 10% |
| Luminosity Tungsten (warm white) avg | 1010 ± 10% |
| Power Consumption (@110 V) | 20 watts each color |
| Type | Dimmable |
| Control | Selectable between warm white and day white |

At one foot the output can be over 1000 lumens, and therefore the light is suitable for stage uses. Therefore, with the same number of light bulbs as high quality fluorescent light to light a stage or set, which bulbs must be changed out for different scenes when different colors are required, use of the bulbs in accordance with the present invention achieves suitable light for the stage or set without having to change any bulbs, whether a scene is to be shot at warm white light or at daylight white.

Therefore, a method of a preferred embodiment of the invention, would be to light a stage or set to be filmed or photographed with a set of bulbs in accordance with the invention, and continue to light the stage or set with the same set of bulbs, selectively switching the bulbs between warm white light and daylight white for different scenes and/or different parts of scenes.

Example 3

A four foot long T12 (1.5" diameter) LED lamp was constructed with four rows of alternating LEDs of a daylight type and tungsten (warm light) type, using the pattern of FIG. 1A. The power consumption is quite low for the light output. Other parameters are the same or substantially the same as in Example 1.

| | |
|---|---|
| Color Temperature (Day white Mode) | 5000 to 5500 K |
| Color Temperature (Warm white Mode) | 2800 to 3200 K |
| CRI (color rendering index) | > 92 |
| Photo Color Correction (CC) Green | < 5G |
| Photo Color Correction (CC) Magenta | < 5M |
| Luminosity Daylight (day white) avg | 1200 lumens ± 10% |
| Luminosity Tungsten (warm white) avg | 1050 lumens ± 10% |
| Power Consumption (@110V) | 20 watts each color |
| Type | Dimmable |
| Control | Selectable between warm white and day white |

Again, luminosity is at least 1000 lumens. Lifespan in Examples 1, 2 and 3 is estimated at 40,000 hours.

To create the LED lamps, in each of the above examples, LEDs in the desired color ranges are selected which provide at least about 1000 lumens. The LEDs are tested to provide the desired light, e.g., with CRI of at least about 90 percent or more, flux of at least about 1000 lumens or more, and purity of color. Preferably, purity of light includes no more than about three percent green, no more than about three percent yellow and no more than about three percent magenta tones. In addition, the LEDs for the T (warm white light) type are selected in the ranges of 2800 to 3300K or about 2800 to 3300K, and more preferably 3050 to 3300K or about 3050 to 3300K, and the D (daylight white light) type are selected to be 5000 to 5800K or about 5000 to 5800K, and more preferably 5000 to 5500K or about 5000 to 5500K and most preferably 5200 to 5400K or about 5200 to 5400K. Alternatively, they may be selected in other ranges disclosed herein.

Figure 8:
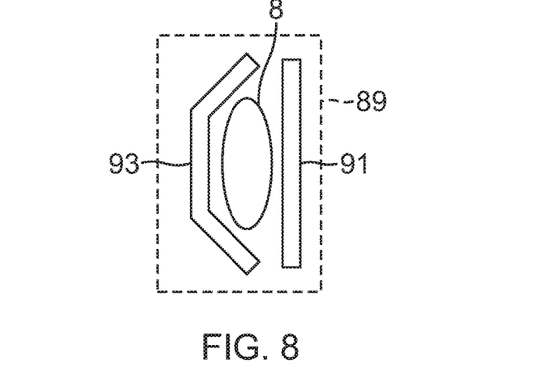
FIG. 8 is a schematic view of an LED lamp with a reflector and a light diffuser in accordance with an embodiment of the present invention.

FIG. 8 is a schematic view of an LED lamp 89 which may be used in the embodiment of FIG. 7. The lamp has a reflector 93 and a light diffuser 91 or gel in accordance with an embodiment of the present invention.

Although the invention has been described using specific terms, devices, and/or methods, such description is for illustrative purposes of the preferred embodiment(s) only. Changes may be made to the preferred embodiment(s) by those of ordinary skill in the art without departing from the scope of the present invention, which is set forth in the following claims. In addition, it should be understood that aspects of the preferred embodiment(s) generally may be interchanged in whole or in part.

What is claimed is:

1. An LED light system configured for providing broad-spectrum white light suitable for a commercial image recording, in a form factor of a fluorescent light tube lamp, the LED light system comprising:
   a. a housing having ends and including a support structure in a form of an elongated and narrow surface having a top side and a bottom side;
   b. a plurality of first LEDs mounted on the top side of the support structure and configured to emit broad-spectrum white light in a first predetermined Kelvin temperature range of cool white light;
   c. a plurality of second LEDs mounted on the top side of the support structure and configured to emit broad-spectrum white light in a second predetermined Kelvin temperature range of warm white light;
   d. circuitry mounted to the support structure including an LED driver circuit configured for driving (i) the first LEDs, to provide light in the first predetermined Kelvin temperature range; or (ii) the second LEDs, to provide light in the second predetermined Kelvin temperature range, wherein the first and second predetermined Kelvin temperature ranges are nonoverlapping, and including a printed circuit board mounted to the support structure for carrying electrical power from a connection to the LED driver circuit and then to the first and second LEDs;
   e. an elongate cover extending substantially a length of the support structure and covering the top side of the support structure for diffusing light emitted by the first and second LEDs; and
   f. wherein the housing and cover together have an elongate linear form factor,
   g. wherein the LED light system is configured for receiving input power to be provided to the LED driver circuit to selectively light the first or second LEDs,
   h. wherein the first and second LEDs are disposed in a plurality of rows distributed along the length of the top side of the support structure to emit light, when selectively lit by the LED driver circuit, along the length of the top side of the support structure,
   i. wherein the light is diffused by the cover and is suitable for the commercial image recording both when the emitted light from the LED light system is in the first temperature range of cool white light and when the emitted light from the LED light system is in the second temperature range of warm white light, and
   j. wherein the light emitted from the LED light system is suitable for the commercial image recording when said emitted light: (i) is at least 1000 lumens when the first LEDs are lit and is also at least 1000 lumens when the second LEDs are lit; (ii) is broad-spectrum white light having a color deviation corresponding to less than five points of green and less than five points of magenta (5M, 5G) of color compensation (CC), and (iii) has a color rendering index of light emitted from each of the first LEDs or each of the second LEDs, whichever respective plurality of first or second LEDs is lit, that is greater than 90.

2. The LED light system of claim 1, wherein the LED light system is provided without a gel or filter.

3. The LED light system of claim 1, wherein the first LEDs are each configured to emit light with a color temperature between 5000 K and 5800 K, and the second LEDs are each configured to emit light with a color temperature between 2800 K and 3300 K.

4. The LED light system of claim 1, wherein the LED driver circuit comprises first and second LED drivers that are separate from each other.

5. The LED light system of claim 4, wherein each of the first and second LED driver drivers has a separate power source.

6. The LED light system of claim 1, wherein the first and second LEDs are phosphor-based light emitters.

7. The LED light system of claim 1, wherein the housing comprises an aluminum housing.

8. The LED light system of claim 1, wherein the housing has a length of about four feet.

9. The LED light system of claim 8, wherein the housing has a cross-sectional dimension of no greater than about 41 mm.

10. The LED light system of claim 1, further comprising a power supply configured to provide at least 20 watts, and wherein the LED driver is configured to selectively drive the first LEDs with at least 20 watts and the second LEDs with at least 20 watts, driving of the first or second LEDS being switchable by a toggle so that only the first LEDs are on and the second LEDs are off, or the first LEDs are off and the second LEDs are on.

11. The LED light system of claim 3, further comprising a power supply configured to provide at least 20 watts, and wherein the LED driver is configured to selectively drive the first LEDs with at least 20 watts and the second LEDs with at least 20 watts, driving of the first or second LEDS being switchable by a toggle so that only the first LEDs are on and the second LEDs are off, or the first LEDs are off and the second LEDs are on.

12. The LED light system of claim 1, further comprising a power supply configured to provide at least 42 watts, and wherein the LED driver is configured to selectively drive the first LEDs with at least 42 watts and the second LEDs with at least 42 watts.

13. The LED light system of claim 8, further comprising a power supply configured to provide at least 42 watts, and wherein the LED driver is configured to selectively drive the first LEDs with at least 42 watts and the second LEDs with at least 42 watts.

14. The LED light system of claim 1, wherein the housing has a manual knob for selectively controlling the LED driver circuit to electronically switch between the first LEDs and the second LEDs.

15. The LED light system of claim 1, wherein the warm white light is tungsten balanced, and the cool white light is daylight balanced.

16. An LED light system configured for providing broad-spectrum white light suitable for a commercial image recording, in a form factor of a fluorescent light tube lamp, the LED light system comprising:
   a. a housing having ends and including a support structure in a form of an elongated and narrow surface having a top side and a bottom side;
   b. a plurality of first LEDs mounted on the top side of the support structure and configured to emit broad-spectrum white light in a first predetermined Kelvin temperature range of cool white light;
   c. a plurality of second LEDs mounted on the top side of the support structure and configured to emit broad-spectrum white light in a second predetermined Kelvin temperature range of warm white light;
   d. circuitry mounted to the support structure including an LED driver circuit configured for driving (i) the first LEDs, to provide light in the first predetermined Kelvin temperature range; or (ii) the second LEDs, to provide light in the second predetermined Kelvin temperature range, wherein the first and second predetermined Kelvin temperature ranges are nonoverlapping, and including a printed circuit board mounted to the support structure for carrying electrical power from a connection to the LED driver circuit and then to the first and second LEDs;
   e. an elongate cover extending substantially a length of the support structure and covering the top side of the support structure for diffusing light emitted by the first and second LEDs;
   f. wherein the housing and cover together have an elongated linear form factor in substantially a T8 or T12 form factor;
   g. wherein the light emitted from the first LEDs and the light emitted from the second LEDs are each broad-spectrum white light having a color deviation corresponding to less than five points of green and less than five points of magenta (5M, 5G) of color compensation (CC);
   h. wherein a color rendering index of the first LEDs and the second LEDs is greater than 90;
   i. wherein the light emitted from the LED light system is at least 1000 lumens when the first LEDs are lit and is also at least 1000 lumens when the second LEDs are lit;
   j. wherein the first and second LEDs are phosphor-based emitters; and
   k. wherein a power supply provides at least 20 watts and the LED driver circuit is configured to selectively drive the first LEDs with at least 20 watts and the second LEDs with at least 20 watts.

17. The LED light system of claim 16, wherein the first LEDs are each configured to emit light with a color temperature between 5000 K and 5800 K, and the second LEDs are each configured to emit light with a color temperature between 2800 K and 3300 K.

18. The LED light system of claim 17, wherein the LED light system is provided without a gel or filter.

19. The LED light system of claim 16, wherein the LED driver circuit comprises first and second LED drivers that are separate from each other.

20. The LED light system of claim 19, wherein each of the first and second LED driver drivers has a separate power source.

21. The LED light system of claim 16, wherein the housing has a cross-sectional dimension of no greater than about 41 mm.

22. The LED light system of claim 21, further comprising a power supply configured to provide at least 42 watts, and wherein the LED driver is configured to selectively drive the first LEDs with at least 42 watts and the second LEDs with at least 42 watts.

23. An LED light system configured for providing broad-spectrum white light suitable for a commercial image recording, in a form factor of a fluorescent light tube lamp, the LED light system comprising:
   a. a housing having ends and including a support structure in a form of an elongated and narrow surface having a top side and a bottom side;
   b. a plurality of first LEDs mounted on the top side of the support structure and configured to emit broad-spectrum white light in a first predetermined Kelvin temperature range of cool white light;
   c. a plurality of second LEDs mounted on the top side of the support structure and configured to emit broad-spectrum white light in a second predetermined Kelvin temperature range of warm white light;

d. electronic circuitry mounted to the support structure including an LED driver circuit configured for selectively electronically switching between driving either (i) the first LEDs, to provide light while the second LEDs are off; or (ii) the second LEDs, to provide light while the first LEDs are off, wherein the first and second predetermined Kelvin temperature ranges are nonoverlapping, and including a printed circuit board mounted to the support structure for carrying electrical power from a connection to the LED driver circuit and then to the first and second LEDs; and e. an elongate cover extending substantially a length of the support structure and covering the top side of the support structure for diffusing light emitted by the first and second LEDs; and f. wherein a color rendering index of light emitted from the first LEDs and from the second LEDs is greater than 90 and the light emitted from the first LEDs and from the second LEDs is broad-spectrum white light having a color deviation corresponding to less than five points of green and less than five points of magenta (5M, 5G) of color compensation (CC);

g. wherein the light emitted from the LED light system is at least 1000 lumens when the first LEDs are lit and is also at least 1000 lumens when the second LEDs are lit;

h. wherein the first LEDs are each configured to emit light with a color temperature between 5000 K and 5800 K, and the second LEDs are each configured to emit light between 2800 K and 3300 K, wherein the warm white light is tungsten balanced, and the cool white light is daylight balanced;

i. wherein the housing and cover together have a linear form factor of a fluorescent light tube lamp having a diameter of no greater than approximately 41 mm and a length no longer than about four feet, j. whereby said light is suitable for the commercial image recording when the light emitted from the LED light system is broad-spectrum white light having a color deviation corresponding to less than five points of green and less than five points of magenta (5M, 5G) of color compensation (CC), a color rendering index of the light emitted from the first LEDs and each of the second LEDs is greater than 90, and the light emitted from the LED light system is at least 1000 lumens when the first LEDs are lit and is also at least 1000 lumens when the second LEDs are lit.

24. The LED light system of claim 23, wherein the LED light system is provided without a gel or filter.

25. The LED light system of claim 23, wherein the LED driver circuit comprises first and second LED drivers that are separate from each other.

26. The LED light system of claim 25, wherein each of the first and second LED driver drivers has a separate power source.

27. The LED light system of claim 23, wherein the first and second LEDs are phosphor-based light emitters.

28. The LED light system of claim 23, wherein the light system is about four feet long, and further comprises a power supply configured to provide at least 42 watts, and wherein the LED driver circuit is configured to selectively drive the first LEDs with at least 42 watts and the second LEDs with at least 42 watts.

29. The LED light system of claim 23, further comprising a power supply configured to provide at least 42 watts, and wherein the LED driver circuit is configured to selectively drive the first LEDs with at least 42 watts and the second LEDs with at least 42 watts.

30. The LED light system of claim 25, further comprising a power supply configured to provide at least 42 watts, and wherein the LED driver circuit is configured to selectively drive the first LEDs with at least 42 watts and the second LEDs with at least 42 watts.

* * * * *

(12) INTER PARTES REVIEW CERTIFICATE (4239th)
United States Patent
Macias (10) Number: US 10,566,895 K1
(45) Certificate Issued: Jan. 26, 2026

(54) TUBE LIGHT WITH IMPROVED LED ARRAY

(71) Applicant: Guillermo Macias

(72) Inventor: Guillermo Macias

(73) Assignee: COLT INTERNATIONAL CLOTHING INC.

Trial Number:

IPR2023-00614 filed Feb. 17, 2023

Inter Partes Review Certificate for:

Patent No.: 10,566,895
Issued: Feb. 18, 2020
Appl. No.: 16/537,932
Filed: Aug. 12, 2019

The results of IPR2023-00614 are reflected in this inter partes review certificate under 35 U.S.C. 318(b).

INTER PARTES REVIEW CERTIFICATE
U.S. Patent 10,566,895 K1
Trial No. IPR2023-00614
Certificate Issued Jan. 26, 2026

AS A RESULT OF THE INTER PARTES REVIEW PROCEEDING, IT HAS BEEN DETERMINED THAT:

Claims 1-3, 6-18, 21-24 and 27-29 are found patentable.

\* \* \* \* \*